(12) United States Patent
Goh

(10) Patent No.: US 9,275,944 B2
(45) Date of Patent: Mar. 1, 2016

(54) SEMICONDUCTOR PACKAGE WITH MULTI-LEVEL DIE BLOCK

(71) Applicant: Infineon Technologies AG, Neubiberg (DE)

(72) Inventor: Kok Chai Goh, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/013,112

(22) Filed: Aug. 29, 2013

(65) Prior Publication Data

US 2015/0061096 A1 Mar. 5, 2015

(51) Int. Cl.
*H01L 23/13* (2006.01)
*H01L 23/495* (2006.01)
(Continued)

(52) U.S. Cl.
CPC .......... *H01L 23/49575* (2013.01); *H01L 23/13* (2013.01); *H01L 23/49503* (2013.01); *H01L 23/49513* (2013.01); *H01L 23/49562* (2013.01); *H01L 24/89* (2013.01); *H01L 25/0652* (2013.01); *H01L 24/29* (2013.01); *H01L 24/32* (2013.01); *H01L 24/33* (2013.01); *H01L 24/40* (2013.01); *H01L 24/45* (2013.01); *H01L 24/48* (2013.01); *H01L 24/83* (2013.01); *H01L 2224/291* (2013.01); *H01L 2224/2919* (2013.01); *H01L 2224/32014* (2013.01); *H01L 2224/32105* (2013.01); *H01L 2224/32145* (2013.01); *H01L 2224/32237* (2013.01); *H01L 2224/32257* (2013.01); *H01L 2224/33181* (2013.01); *H01L 2224/33505* (2013.01); *H01L 2224/40101* (2013.01); *H01L 2224/40137* (2013.01); *H01L 2224/45014* (2013.01); *H01L 2224/45015* (2013.01); *H01L 2224/48101* (2013.01); *H01L 2224/48137* (2013.01); *H01L 2224/49096* (2013.01); *H01L 2224/8385* (2013.01); *H01L 2224/83801* (2013.01);
(Continued)

(58) Field of Classification Search
CPC .............. H01L 23/49575; H01L 24/89; H01L 23/49503
See application file for complete search history.

(56) References Cited

U.S. PATENT DOCUMENTS

| 5,559,316 A * | 9/1996 | Tomoda ........................ 257/666 |
| 8,178,954 B2 * | 5/2012 | Xue et al. ...................... 257/666 |

(Continued)

OTHER PUBLICATIONS

Author Unknown. "Dual N-Channel OptiMOS MOSFET." Product Brief BSZ0907ND, Revision 2.0. Infineon Technologies AG, 2011. pp. 1-13.

(Continued)

*Primary Examiner* — Roy Potter
*Assistant Examiner* — Paul Patton
(74) *Attorney, Agent, or Firm* — Murphy, Bilak & Homiller, PLLC

(57) ABSTRACT

A semiconductor package includes a block having a first side, a second side opposite the first side and a recessed region extending from the second side toward the first side so that the block has a thinner part in the recessed region and a thicker part outside the recessed region. The semiconductor package further includes a first semiconductor die and a second semiconductor die each having opposing first and second sides. The first semiconductor die is disposed in the recessed region of the block and attached to the thinner part of the block at the first side of the first semiconductor die. The second semiconductor die is attached to the second side of the first semiconductor die at a first side of the second semiconductor die.

26 Claims, 8 Drawing Sheets

(51) Int. Cl.
*H01L 23/00* (2006.01)
*H01L 25/065* (2006.01)

(52) U.S. Cl.
CPC ............... *H01L 2224/83851* (2013.01); *H01L 2924/00014* (2013.01); *H01L 2924/1305* (2013.01); *H01L 2924/13055* (2013.01); *H01L 2924/13091* (2013.01); *H01L 2924/15153* (2013.01)

(56) References Cited

U.S. PATENT DOCUMENTS

2002/0105061 A1* 8/2002 Abe et al. ..................... 257/666
2005/0285249 A1* 12/2005 Carney et al. ................ 257/685
2009/0130799 A1* 5/2009 Havanur ....................... 438/109

OTHER PUBLICATIONS

Author Unknown. "PowerStage 3×3." Product Brief BSZ0908ND, Revision 2.0. Infineon Technologies AG, 2011. pp. 1-13.

Author Unknown. "Power stage 3×3: Halfbridge handles 12.5 A in 9 mm². " Product Brief. Infineon Technologies Austria AG, Nov. 2012. pp. 1-2.

Author Unknown. "Synchronous Buck NexFET™ Power Block." Product Brief CSD86330Q3D. Texas Instrument, Oct. 2010. pp. 1-20.

Author Unknown. "Synchronous Buck NexFET™ Power Block." Product Brief CSD86350Q5D. Texas Instrument, May 2010. pp. 1-21.

* cited by examiner

US 9,275,944 B2

SEMICONDUCTOR PACKAGE WITH MULTI-LEVEL DIE BLOCK

TECHNICAL FIELD

The present application relates to semiconductor packages, in particular semiconductor packages which include multiple semiconductor dies.

BACKGROUND

Many types of semiconductor packages include multiple semiconductor dies (chips). For example in multi-die SO-type packages, each die is attached to a different die paddle so that the number of die paddles included in the package equals the number of dies in the package. Each die paddle occupies a certain area and SO packages have a maximum size, limiting the number and size of the dies that can be included in the package. Other types of multi-die packages house a half-bridge circuit. The half-bridge circuit is an electronic circuit that enables a voltage to be applied across a load in either direction. Half-bridge circuits typically include a high-side transistor and a low-side transistor implemented in different semiconductor dies. The source terminal of the high-side transistor die is connected to the drain terminal of the low-side transistor die to form the output of the half-bridge circuit. Conventional half-bride packages connect the source terminal of the high-side transistor die to the drain terminal of the low-side transistor die by a metal clip or additional bond wires, which in each case increase package size and cost. This connection also has some non-negligible electrical resistance, increasing power loss of the half-bridge circuits. Conventional half-bride packages also typically employ a different die paddle for each transistor die included in the package, further increasing the size and cost of the package.

SUMMARY

According to an embodiment of a semiconductor package, the package comprises a block having a first side, a second side opposite the first side and a recessed region extending from the second side toward the first side so that the block has a thinner part in the recessed region and a thicker part outside the recessed region. The semiconductor package further comprises a first semiconductor die and a second semiconductor die each having opposing first and second sides. The first semiconductor die is disposed in the recessed region of the block and attached to the thinner part of the block at the first side of the first semiconductor die. The second semiconductor die is attached to the second side of the first semiconductor die at a first side of the second semiconductor die.

According to an embodiment of a method of manufacturing a semiconductor package, the method comprises: forming a recessed region in a block so that the block has a thinner part in the recessed region and a thicker part outside the recessed region; disposing a first semiconductor die having opposing first and second sides in the recessed region of the block so that the first side of the first semiconductor die faces the thinner part of the block; attaching the first side of the first semiconductor die to the block; disposing a second semiconductor die having opposing first and second sides on the first semiconductor die so that the first side of the second semiconductor die faces the second side of the first semiconductor die; and attaching the first side of the second semiconductor die to the second side of the first semiconductor die.

According to an embodiment of a lead frame, the lead frame comprises a die paddle having a first side, a second side opposite the first side and a recessed region extending from the second side toward the first side so that the die paddle has a thinner part in the recessed region and a thicker part outside the recessed region. The lead frame further comprises a plurality of electrically conductive leads spaced apart from each other and the die paddle. One of the leads has a recessed region so that the lead has a thinner part in the recessed region of the lead and a thicker part outside the recessed region of the lead.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a semiconductor package that includes a block such as a metal block, ceramic block or a die paddle of a lead frame that has a recessed region in which a semiconductor die included in the package is disposed. The block has a thinner part in the recessed region and a thicker part outside the recessed region. The block can serve as a heat sink and/or provide a point of external electrical connection to the semiconductor die disposed in the recessed region. This die is attached to the thinner part of the block at one side of the die. Another die included in the package is electrically conductively attached to the other side of the die disposed in the recessed region of the block. The package described herein has a reduced size by eliminating at least one die paddle for each stacked arrangement of dies, and provides direct electrical connection between stacked dies. Also, the stacked die arrangement does not increase the overall package thickness because one of the dies in the stacked arrangement is disposed in the recessed region of the block and the depth of the recessed region can be selected to fully accommodate the thickness of that die. The packages described herein can include any number of semiconductor dies, and the number of dies included in a package depends on the type of circuit in which the dies are employed.

Figure 1B:
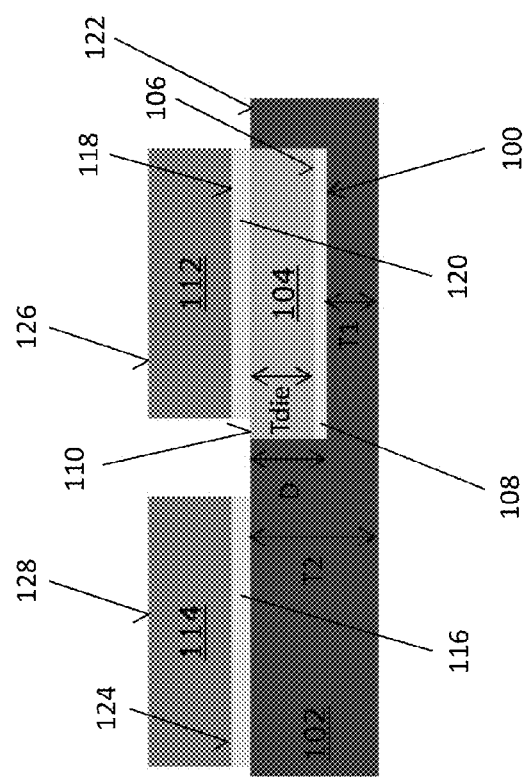
FIGS. 1A and 1B illustrate cross-sectional views of an embodiment of a semiconductor package with a multi-level die block during different stages of manufacturing.
Figure 1A:
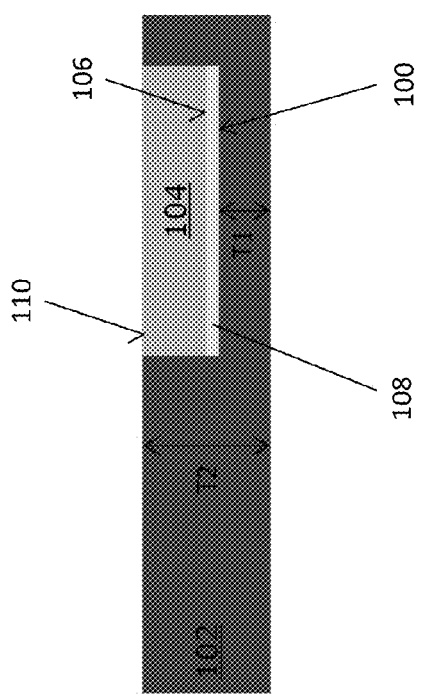

FIGS. 1A and 1B illustrate a cross-sectional view of an embodiment of a semiconductor package during different stages of manufacturing. FIG. 1A shows the package after a recessed region 100 is formed in a block 102 so that the block 102 has a thinner part (T1) in the recessed region 100 and a thicker part (T2) outside the recessed region 100. The block 102 can be a metal block, ceramic block, a die paddle of a lead frame, etc. The recessed region 100 can be formed in the block 102 by any standard material removal process such as chemical etching, laser etching, 3D printing, etc.

A first semiconductor die 104 is disposed in the recessed region 100 of the block 102 so that the bottom side 106 of the die 104 faces the thinner part T1 of the block 100. The bottom side 106 of the die 104 is attached to the thinner part T1 of the block 102. The die 104 can be attached to the thinner part T1 of the block 102 via an electrically conductive or insulating die attach material 108 such as solder, glue (conductive or non-conductive), etc. In other embodiments, the material 108 interposed between the first die 104 and the thinner part T1 of the block 102 is a conductive or non-conductive spacer.

In some cases, the die 104 can be a vertical device in which current flows in the vertical direction between the bottom and top sides 106, 110 of the die 104. This type of die has terminals at both sides of the die 104. For example in the case of a power transistor die such as a power MOSFET, the transistor die 104 can have a drain terminal at the bottom side 106 of the die 104 and a source terminal and a gate terminal at the top side 110 of the die 104. The drain terminal can be electrically conductively attached to the thinner part T1 of the block 102 by a solder die attach or electrically conductive adhesive material 108. In the case of a diode, the diode die 104 can have a cathode terminal at the bottom side 106 of the die 104 and an anode terminal at the top side 110 of the die 104. The cathode terminal can be electrically conductively attached to the thinner part T1 of the block 102 by a solder die attach or electrically conductive adhesive material 108.

In other cases, the die 104 can be a lateral device in which current flows in the lateral direction along the top side 110 of the die 104. This type of die has terminals only at the top side 110 of the die 104. The bottom side 106 of the lateral die 104 is devoid of terminals, but serves as a heat dissipation pathway for the die 104. The bottom side 106 of a lateral die 104 can be attached to the thinner part T1 of the block 102 by a thermally conductive material 108 that is not necessarily electrically conductive. Die terminals are not shown in FIGS. 1A and 1B for ease of illustration.

FIG. 1B shows the package after a second semiconductor die 112 is disposed on the top side 110 of the first semiconductor die 104, and a third semiconductor die 114 is attached to the thicker part T2 of the block 102 via a die attach material 116. The bottom side 118 of the second semiconductor die 112 is attached to the top side 110 of the first semiconductor die 104 via a die attach material 120. The third die 114 is spaced apart from the first and second semiconductor dies 104, 112 in the lateral direction (i.e. the direction perpendicular to the vertical direction). The first and second dies 104, 112 are disposed in a stacked arrangement. The depth (D) of the recessed region 100 in the block 102 can be such that the recessed region 100 accommodates the full thickness (Tdie) of the first die 104. Alternatively, part of the first die 104 can extend beyond the top side 122 of the block 102. In each case, one or more terminals at the bottom side 118 of the second die 112 can be electrically conductively attached to corresponding terminal(s) at the top side 110 of the first die 104 to form desired electrical connection(s) between the stacked dies 104, 112. The bottom side 124 of the third die 114 can be electrically conductively or non-conductively attached to the thicker part T2 of the block 102, depending on the type of die 114 and circuit included in the package. Electrical connections between the top sides 126, 128 of the second and third dies 112, 114 can be realized by metal clips, bond wires, ribbons, etc. Other electrical connections can be made to leads of the package. These electrical connections and leads are not shown in FIGS. 1A and 1B for ease of illustration. The package can be molded after the internal electrical connections within the package are completed.

Figure 2:
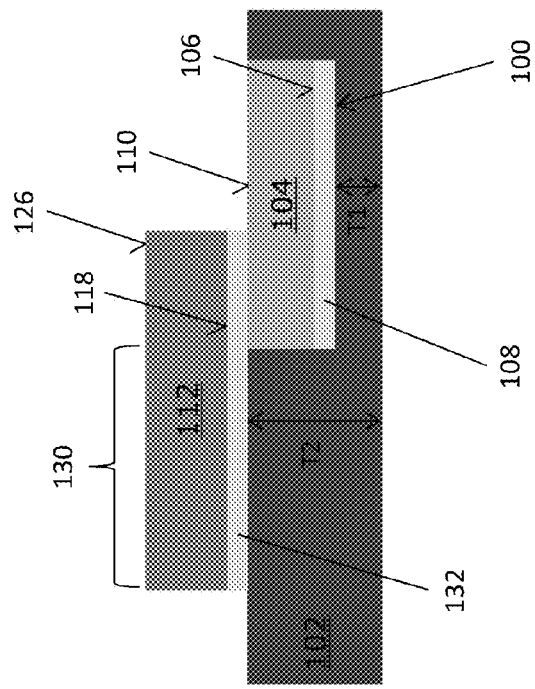
FIG. 2 illustrates a cross-sectional view of another embodiment of a semiconductor package with a multi-level die block.

FIG. 2 illustrates a cross-sectional view of another embodiment of a semiconductor package. The embodiment shown in FIG. 2 is similar to the one shown in FIG. 1B, however part 130 of the second semiconductor die 112 overhangs the thicker part T2 of the block 102. Depending on the type of dies (vertical or lateral), the first die 104 can be attached to the thinner part T1 of the block 102 by an electrically conductive or non-conductive die attach material or spacer 108. For example the material 108 interposed between the bottom side 106 of the first die 104 and the thinner part T1 of the block 102 can be a non-conductive spacer 108 so that the first die 104 is electrically disconnected from the block 102, and a terminal at the bottom side 118 of the second die 112 can be electrically conductively attached to a corresponding terminal at the top side 110 of the first die 104 and to the thicker part T2 of the block 102 by an electrically conductive die attach material 132. In this embodiment, the block 102 is electrically conductive and forms a lead of the package.

Figure 3:
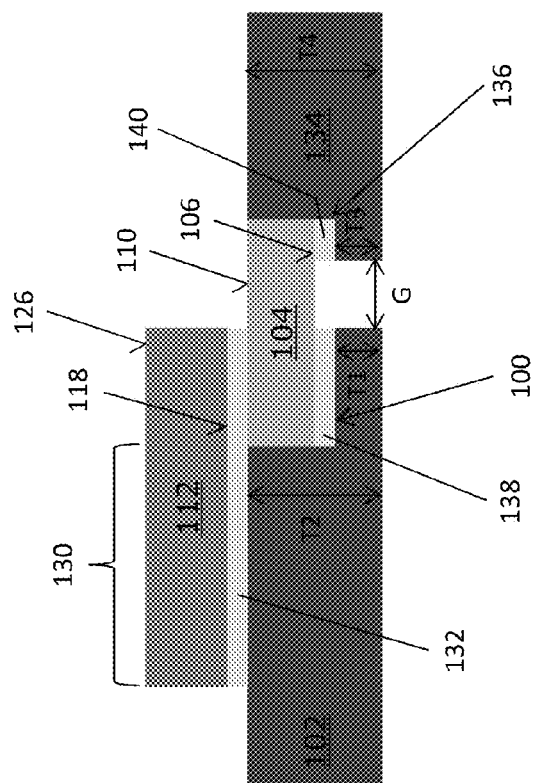
FIG. 3 illustrates a cross-sectional view of yet another embodiment of a semiconductor package with a multi-level die block.

FIG. 3 illustrates a cross-sectional view of yet another embodiment of a semiconductor package. The embodiment shown in FIG. 3 is similar to the one shown in FIG. 2, however the package also includes a second block 134 spaced apart from the first block 102. The second block 134 has a recessed region 136 so that the second block 134 has a thinner part (T3) in the recessed region 136 of the second block 134 and an optional thicker part (T4) outside the recessed region 136 of the second block 134. The first semiconductor die 104 is partly disposed in the recessed region 100 of the first block 102 and partly disposed in the recessed region 136 of the second block 134 so that the first semiconductor die 104 spans a gap (G) between the blocks 102, 134. In one embodiment, the second block 134 is an electrically conductive lead of the package and the first and second dies 104, 112 are vertical devices each with terminals at both sides 106, 110, 118, 126 of the respective dies 104, 112. The terminals are not shown in FIG. 3 for ease of illustration. The terminal at the bottom side 106 of the first die 104 is attached to the thinner part T1 of the first block 102 by an electrically insulating die attach material and/or an electrically insulating spacer 138, and electrically conductively attached to the thinner part T3 of the second block 134 by an electrically conductive die attach material 140. If a spacer 138 is used between the first die 104 and the thinner part T1 of the first block 102, the thickness of the spacer 138 can accommodate the thickness of the die attach material 140 that attaches the bottom side 106 of the first die 104 to the thinner part T3 of the second block 134.

Figure 4B:
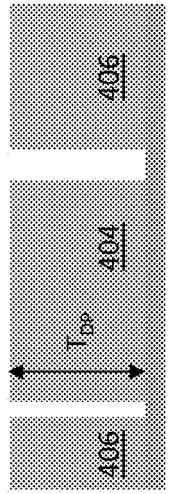
FIGS. 4A through 4M illustrate cross-sectional views of another embodiment of a semiconductor package with a multi-level die block during different stages of manufacturing.
Figure 4C:
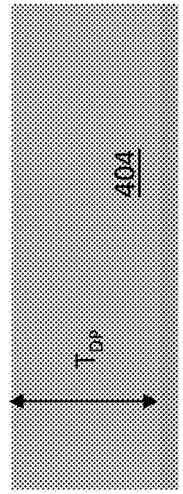

FIGS. 4A through 4M illustrate different views of an embodiment of a semiconductor package during different stages of manufacturing. The integrated circuit contained in the package is a half-bridge circuit of the kind shown in FIG. 5. The half-bridge circuit includes a high-side transistor die 400, a low-side transistor die 402 and an input capacitor (Cin) coupled between the positive input (VIN) and the negative input (PGND) of the half-bride circuit. The negative input can be ground in some configurations. In the exemplary circuit diagram shown in FIG. 5, the transistor dies 400, 402 are MOSFET (metal oxide semiconductor field effect transistor) dies each having gate (Gn), drain (Dn) and source (Sn) terminals.

The drain terminal (D1) of the high-side transistor die 400 is electrically connected to the positive input (VIN) of the half-bridge circuit. The source terminal (S1) of the high-side transistor die 400 is electrically connected to the drain terminal (D2) of the low-side transistor die 402 to form the output (SW) of the half-bridge circuit. The source terminal (S2) of the low-side transistor die 402 is electrically connected to the negative input (PGND). The gate terminals (G1, G2) of the transistor dies 400, 402 serve as respective control signal inputs (IN1, IN2). IGBTs (insulated gate bipolar transistors) can be used instead of MOSFETs where the collector connections of the IGBTs would correspond to the drain connections of the MOSFETs and the emitter connections of the IGBTs would correspond to the source connections of the MOSFETs. In general the type and number of semiconductor dies included in the package depends on the particular application for which the package is designed, and the stacked die embodiments described herein can be used in each case.

Figure 4A:
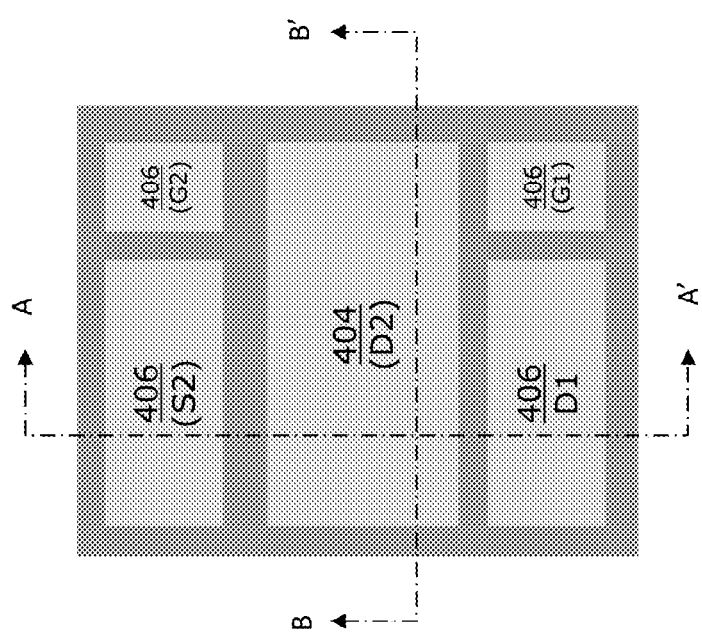
Figure 5:
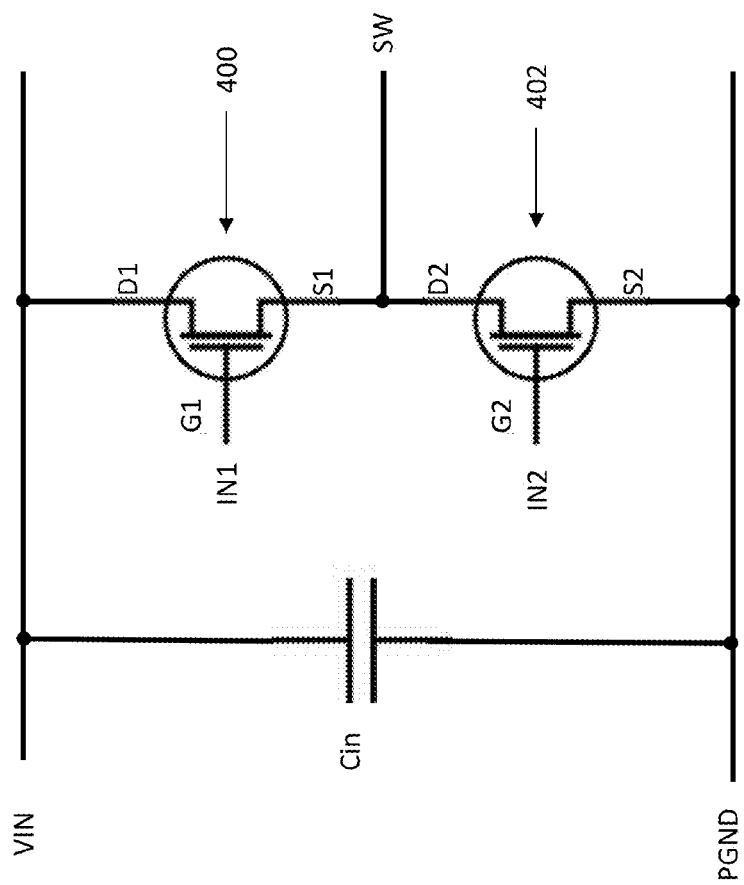
FIG. 5 illustrates a schematic diagram of a half-bride circuit included in the semiconductor package of FIG. 4.

Returning to the manufacture of the package, FIG. 4A illustrates a plan view of a die paddle 404 and leads 406 of a lead frame. The leads 406 are labeled in FIG. 4A with an identifier (D1, D2, G1, G2, S2) corresponding to the die terminal to be later connected to each lead 406. The die paddle 404 is to be connected to the drain terminal (D2) of the low side transistor 402.

FIG. 4B illustrates a cross-sectional view along the line labeled A-A' in FIG. 4A. FIG. 4C illustrates a cross-sectional view along the line labeled B-B' in FIG. 4A. The die paddle 404 has a certain thickness ($T_{DP}$) e.g. of about 250 μm. Other die paddle thicknesses are contemplated.

Figure 4E:
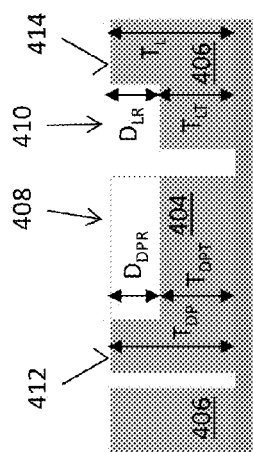
Figure 4F:
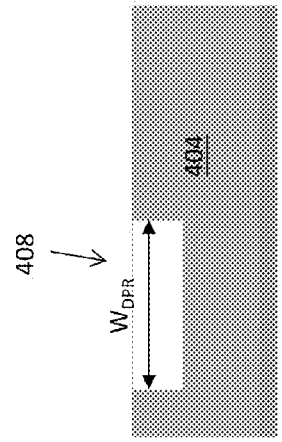
Figure 4D:
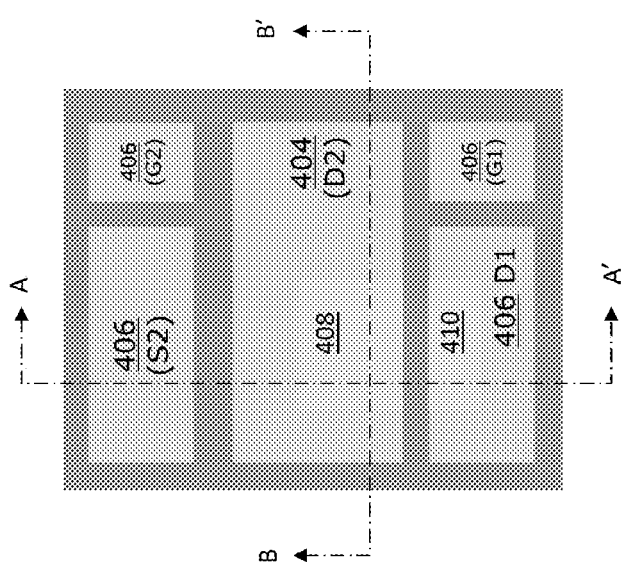

FIG. 4D illustrates a plan view of the die paddle 404 and leads 406 after a recessed region 408 is formed in the die paddle 404 and a recessed region 410 is formed in the lead 406 associated with the drain terminal (D1) of the high-side transistor 400. FIG. 4E illustrates a cross-sectional view along the line labeled A-A' in FIG. 4D, and FIG. 4F illustrates a cross-sectional view along the line labeled B-B' in FIG. 4D. The recessed regions 408, 410 can be formed by any standard material removal process such as chemical etching, laser etching, 3D printing, etc. The die paddle 404 has a thinner part ($T_{DPT}$) in the recessed region 408 and a thicker part ($T_{DP}$) outside the recessed region 408. The recessed regions 408, 410 can be fully etched to ease lead frame manufacturing, and constructed from more than one die paddle or lead.

The recessed region 408 of the die paddle 404 has a certain width ($W_{DPR}$) to accommodate the semiconductor die 400 to be disposed in the recessed region 408 of the die paddle 404. The recessed region 408 of the die paddle 404 extends to a depth ($D_{DPR}$) from the top side 412 of the die paddle 404. In one embodiment, $D_{DPR}$ ranges from 50 μm to 120 μm. In general, $D_{DPR}$ depends on the thickness of the semiconductor die 400 to be disposed in the recessed region 408 of the die paddle 404. $D_{DPR}$ can be selected to fully or partly accommodate the die thickness as previously described herein.

The lead 406 with the recessed region 410 likewise has a thinner part ($T_{LT}$) in its recessed region 410 and an optional thicker part ($T_L$) outside its recessed region 410. The recessed region 410 of the lead 406 extends to a depth ($D_{LR}$) from the top side 414 of the lead 410. In one embodiment, the die paddle 404 and the lead 406 have the same thickness (i.e. $T_{DP}=T_L$) and the recessed regions 408, 410 extend to the same depth (i.e. $D_{DPR}=D_{LR}$). In general, $D_{LR}$ depends on the thickness of the semiconductor die 400 to be disposed in the recessed region 410 of the lead 406 and can be selected to fully or partly accommodate the die thickness as previously described herein.

Figure 4H:
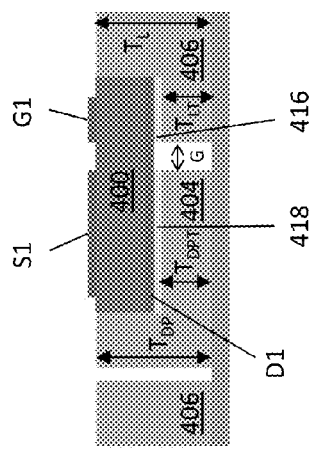
Figure 4I:
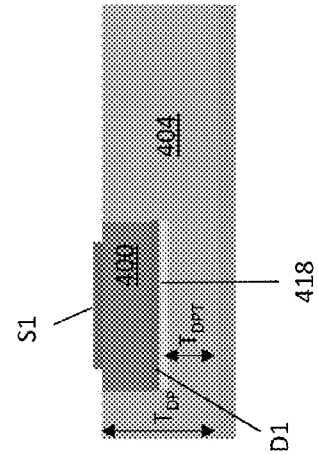
Figure 4G:
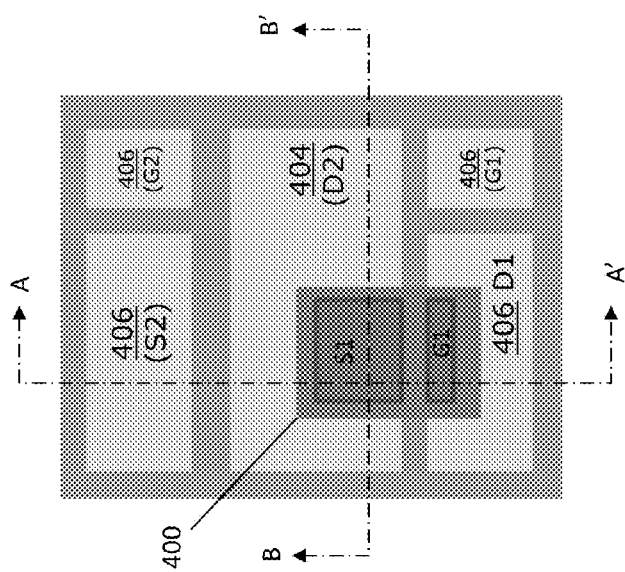

FIG. 4G illustrates a plan view of the die paddle 404 and leads 406 after the high-side transistor die 400 is partly disposed in the recessed region 408 of the die paddle 404 and partly disposed in the recessed region 410 of the lead 406 so that high-side transistor die 400 spans a gap (G) between the die paddle 404 and the lead 406 with the recessed region 410. FIG. 4H illustrates a cross-sectional view along the line labeled A-A' in FIG. 4G, and FIG. 4I illustrates a cross-sectional view along the line labeled B-B' in FIG. 4G. The drain terminal (D1) of the high-side transistor die 400 is electrically conductively attached to the thinner part $T_{LT}$ of the lead 406 by a conductive die attach material 416 such as solder or a conductive adhesive. The drain terminal (D1) of the high-side transistor die 400 is also attached to the thinner part $T_{DPT}$ of the die paddle 404 by a non-conductive spacer 418 according to this embodiment. The spacer 418 accommodates the thickness of the die attach material 416 which attaches the drain terminal (D1) of the high-side transistor die 400 to the thinner part $T_{LT}$ of the lead 406. The gate terminal (G1) and source terminal (S1) of the high-side transistor die 400 are at the opposite side of the die 400 as the drain terminal (D1) and face away from the die paddle 404.

Figure 4K:
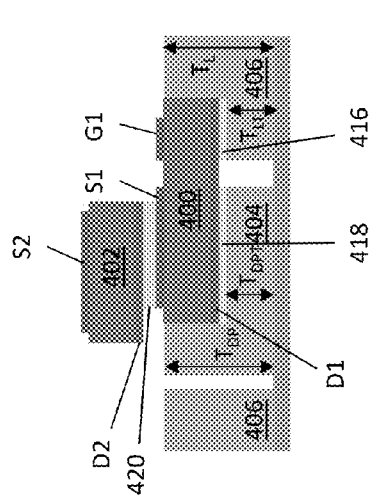
Figure 4L:
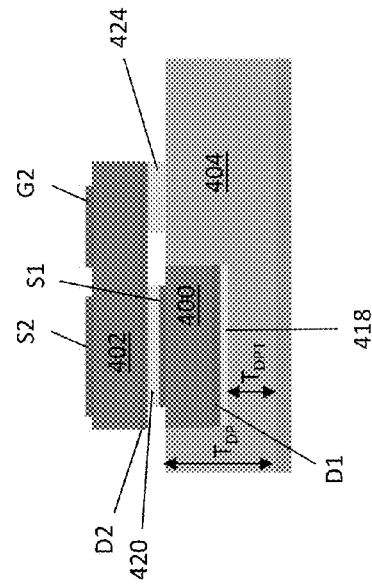
Figure 4J:
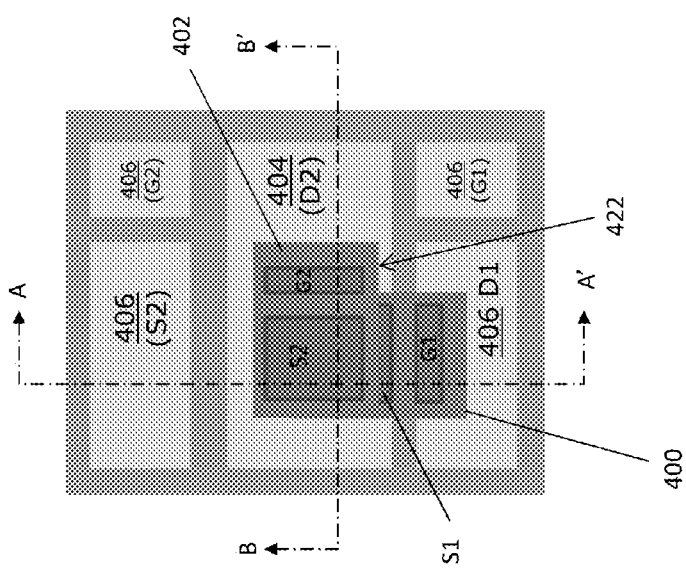

FIG. 4J illustrates a plan view of the die paddle 404 and leads 406 after the drain terminal (D2) of the low-side transistor die 402 is electrically conductively attached to the source terminal (S1) of the high-side transistor die 400 via a conductive die attach material 420 such as solder or a conductive adhesive. FIG. 4K illustrates a cross-sectional view along the line labeled A-A' in FIG. 4J, and FIG. 4L illustrates a cross-sectional view along the line labeled B-B' in FIG. 4J.

The low-side transistor die 402 is disposed on the high-side transistor die 400 so that the gate terminal (G1) of the high-side transistor die 400 remains uncovered by the low-side transistor die 402 in FIGS. 4J and 4K. Further according to this embodiment, part 422 of the low-side transistor die 402 overhangs the thicker part $T_{DP}$ of the die paddle 404 as shown in FIGS. 4J and 4L, or can be attached by a die attach material 424. The drain terminal (D2) of the low-side transistor die 402 is also electrically conductively attached to the thicker part $T_{DP}$ of the die paddle 404 by a die attach material 424, and the die paddle 404 forms the output (SW) of the half-bridge circuit.

Figure 4M:
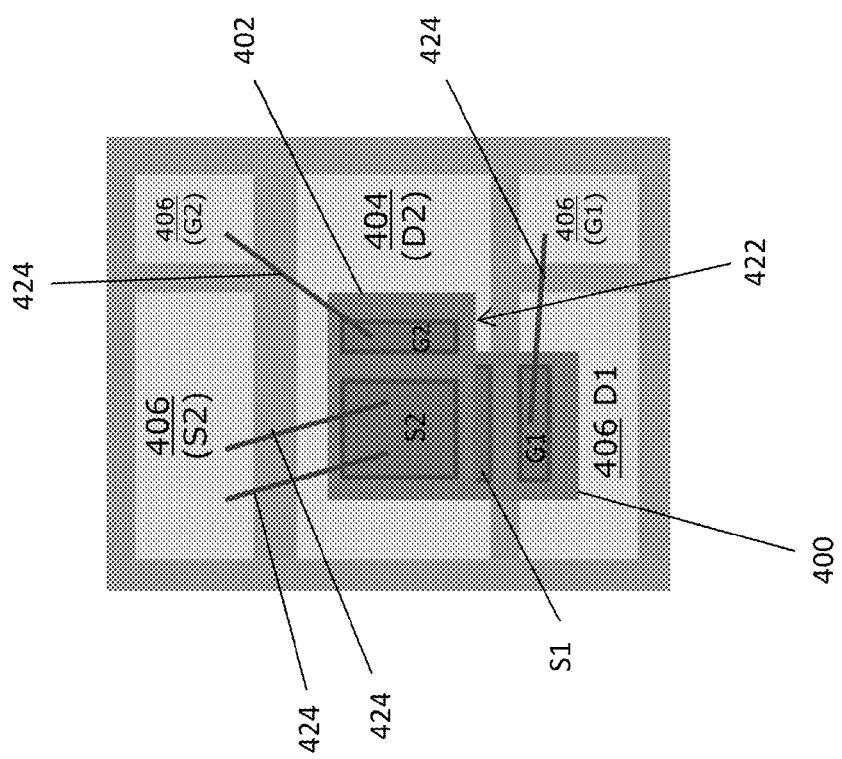

FIG. 4M illustrates a plan view of the die paddle 404 and leads 406 after the terminals G1, G2, S2 at the top sides of the high-side and low-side transistor dies 400, 402 are electrically connected to the respective terminals 406 of the package via connectors 424 such as metal clips, bond wire, ribbons, etc. For example, the gate terminal (G1) of the high-side transistor die 400 is electrically connected to the corresponding package lead 406, the source terminal (S2) of the low-side transistor die 402 is electrically connected to the corresponding package lead 406, and the gate terminal (G2) of the low-side transistor die 402 is electrically connected to the corresponding package lead 406. The package can be encapsulated after these connections are formed.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
a block having a first side, a second side opposite the first side and a recessed region extending from the second side toward the first side so that the block has a thinner part in the recessed region and a thicker part outside the recessed region;
a first semiconductor die having opposing first and second sides, the first semiconductor die disposed in the recessed region of the block and attached to the thinner part of the block at the first side of the first semiconductor die; and
a second semiconductor die attached to the second side of the first semiconductor die at a first side of the second semiconductor die, wherein a part of the second semiconductor die overhangs the thicker part of the block.

2. The semiconductor package of claim 1, further comprising an electrically insulating spacer disposed in the recessed region of the block and interposed between the first semiconductor die and the thinner part of the block.

3. The semiconductor package of claim 2, wherein a terminal at the first side of the second semiconductor die is electrically conductively attached to a terminal at the second side of the first semiconductor die and to the thicker part of the block.

4. The semiconductor package of claim 1, further comprising a plurality of electrically conductive leads, wherein the first semiconductor die has a terminal at the second side of the first semiconductor die that is uncovered by the second semiconductor die and electrically connected to a first one of the leads, and wherein the second semiconductor die has a terminal at a second side of the second semiconductor die that is electrically connected to a second one of the leads.

5. The semiconductor package of claim 1, further comprising a lead that has a recessed region so that the lead has a thinner part in the recessed region of the lead and a thicker part outside the recessed region of the lead, wherein the first semiconductor die is partly disposed in the recessed region of the block and partly disposed in the recessed region of the lead, and wherein the first semiconductor die has a terminal at the first side of the first semiconductor die that is electrically conductively attached to the thinner part of the lead.

6. The semiconductor package of claim 5, further comprising an electrically insulating spacer disposed in the recessed region of the block and interposed between a terminal at the first side of the first semiconductor die and the thinner part of the block.

7. The semiconductor package of claim 1, wherein the block is a die paddle of a lead frame.

8. The semiconductor package of claim 1, further comprising an additional block spaced apart from the other block and having a recessed region so that the additional block has a thinner part in the recessed region of the additional block and a thicker part outside the recessed region of the additional block, and wherein the first semiconductor die is partly disposed in the recessed region of the block and partly disposed in the recessed region of the additional block so that the first semiconductor die spans a gap between the blocks.

9. The semiconductor package of claim 1, further comprising a third semiconductor die attached to the thicker part of the block and spaced apart from the first and second semiconductor dies.

10. The semiconductor package of claim 1, further comprising a spacer disposed in the recessed region of the block and interposed between the first semiconductor die and the thinner part of the block.

11. The semiconductor package of claim 1, wherein the recessed region of the block extends to a depth of 50 μm to 120 μm from the second side of the block.

12. The semiconductor package of claim 1, wherein the first semiconductor die is a high-side transistor die of a half-bridge circuit and the second semiconductor die is a low-side transistor die of the half-bridge circuit, wherein the high-side transistor die has a drain terminal attached to the thinner part of the block and a source terminal and a gate at an opposing side of the high-side transistor die, wherein the low-side transistor die has a drain terminal electrically conductively attached to the source terminal of the high-side transistor die and a source terminal and a gate terminal at an opposing side of the low-side transistor die, and wherein the low-side transistor die is disposed on the high-side transistor die so that the gate terminal of the high-side transistor die remains uncovered by the low-side transistor die.

13. The semiconductor package of claim 12, wherein part of the low-side transistor die overhangs the thicker part of the block.

14. The semiconductor package of claim 13, further comprising an electrically insulating spacer disposed in the recessed region of the block and interposed between the high-side transistor die and the thinner part of the block.

15. The semiconductor package of claim 14, wherein the drain terminal of the low-side transistor die is electrically conductively attached to the thicker part of the block, and wherein the block is an output lead of the package.

16. The semiconductor package of claim 12, further comprising a plurality of electrically conductive leads, wherein the gate terminal of the high-side transistor die is electrically connected to a first one of the leads, wherein the source terminal of the low-side transistor die is electrically connected to a second one of the leads, and wherein the gate terminal of the low-side transistor die is electrically connected to a third one of the leads.

17. The semiconductor package of claim 16, wherein a fourth one of the leads has a recessed region so that the fourth lead has a thinner part in the recessed region of the fourth lead and a thicker part outside the recessed region of the fourth lead, wherein the high-side transistor die is partly disposed in the recessed region of the block and partly disposed in the recessed region of the fourth lead, and wherein the drain terminal of the high-side transistor die is electrically conductively attached to the thinner part of the fourth lead.

18. The semiconductor package of claim 17, wherein the drain terminal of the high-side transistor die extends from over the recessed region of the block to over the recessed region of the fourth lead, the semiconductor package further comprising an electrically insulating spacer disposed in the recessed region of the block and interposed between the drain terminal of the high-side transistor die and the thinner part of the block.

19. A method of manufacturing a semiconductor package, the method comprising:
forming a recessed region in a block so that the block has a thinner part in the recessed region and a thicker part outside the recessed region;

disposing a first semiconductor die having opposing first and second sides in the recessed region of the block so that the first side of the first semiconductor die faces the thinner part of the block;

attaching the first side of the first semiconductor die to the block;

disposing a second semiconductor die having opposing first and second sides on the first semiconductor die so that the first side of the second semiconductor die faces the second side of the first semiconductor die and a part of the second semiconductor die overhangs the thicker part of the block; and attaching the first side of the second semiconductor die to the second side of the first semiconductor die.

20. The method of claim 19, further comprising:

providing a plurality of electrically conductive leads;

electrically connecting a terminal at the second side of the first semiconductor die that is uncovered by the second semiconductor die to a first one of the leads; and electrically connecting a terminal at the second side of the second semiconductor die to a second one of the leads.

21. The method of claim 19, further comprising:

providing an electrically conductive lead;

forming a recessed region in the lead so that the lead has a thinner part in the recessed region of the lead and a thicker part outside the recessed region of the lead, wherein the first semiconductor die is partly disposed in the recessed region of the block and partly disposed in the recessed region of the lead; and electrically conductively attaching a terminal at the first side of the first semiconductor die to the thinner part of the lead.

22. The method of claim 21, further comprising disposing an electrically insulating spacer between the terminal at the first side of the first semiconductor die and the thinner part of the block.

23. A lead frame, comprising:

a die paddle having a first side, a second side opposite the first side and a recessed region extending from the second side toward the first side so that the die paddle has a thinner part in the recessed region and a thicker part outside the recessed region; and a plurality of electrically conductive leads spaced apart from each other and the die paddle, wherein one or more of the leads has a recessed region so that the one or more leads has a thinner part in the recessed region of the one or more leads and a thicker part outside the recessed region of the one or more leads.

24. A semiconductor package, comprising:

a block having a first side, a second side opposite the first side and a recessed region extending from the second side toward the first side so that the block has a thinner part in the recessed region and a thicker part outside the recessed region;

a first semiconductor die having opposing first and second sides, the first semiconductor die disposed in the recessed region of the block and attached to the thinner part of the block at the first side of the first semiconductor die;

a second semiconductor die attached to the second side of the first semiconductor die at a first side of the second semiconductor die; and a third semiconductor die attached to the thicker part of the block and spaced apart from the first and second semiconductor dies.

25. The semiconductor package of claim 1, wherein the part of the second semiconductor die that overhangs the thicker part of the block attaches to the thicker part of the block.

26. The method of claim 19, further comprising:

attaching the part of the second semiconductor die that overhangs the thicker part of the block to the thicker part of the block.

* * * * *